United States Patent
Mulawski et al.

(10) Patent No.: US 8,810,314 B2
(45) Date of Patent: Aug. 19, 2014

(54) ENVELOPE TRACKING AMPLIFIER

(71) Applicant: Auriga Measurement Systems, LLC, Chelmsford, MA (US)

(72) Inventors: Steven A. Mulawski, Tyngsborough, MA (US); Yusuke Tajima, Acton, MA (US)

(73) Assignee: Auriga Measurement Systems, LLC, Chelmsford, MA (US)

( * ) Notice: Subject to any disclaimer, the term of this patent is extended or adjusted under 35 U.S.C. 154(b) by 0 days.

(21) Appl. No.: 13/767,018

(22) Filed: Feb. 14, 2013

(65) Prior Publication Data

US 2013/0207721 A1 Aug. 15, 2013

Related U.S. Application Data

(60) Provisional application No. 61/599,101, filed on Feb. 15, 2012.

(51) Int. Cl.
*H03G 3/20* (2006.01)

(52) U.S. Cl.
USPC .......................... 330/136; 330/146

(58) Field of Classification Search
USPC .......................... 330/136, 129, 146
See application file for complete search history.

(56) References Cited

U.S. PATENT DOCUMENTS

| | | | |
|---|---|---|---|
| 4,879,641 A * | 11/1989 | Rossi et al. | 363/98 |
| 6,211,728 B1 * | 4/2001 | Chen et al. | 330/10 |
| 6,255,907 B1 * | 7/2001 | Alexandersen | 330/146 |
| 6,278,872 B1 | 8/2001 | Poulin et al. | |
| 6,788,151 B2 | 9/2004 | Shvarts et al. | |
| 7,072,636 B2 | 7/2006 | Dobrovolny | |
| 7,482,869 B2 | 1/2009 | Wilson | |
| 8,362,839 B2 * | 1/2013 | Hajimiri et al. | 330/297 |
| 2002/0163375 A1 | 11/2002 | Wu et al. | |
| 2009/0134951 A1 | 5/2009 | Plaze et al. | |

OTHER PUBLICATIONS

Chappell, et al.; "Digital Array Panel Development," Phased Array Systems and Technology (ARRAY); 2001 IEEE International Symposium on; Oct. 12-15, 2010; 2010; pp. 50-60.

Auriga Microwave; "DARPA Proposal—Redacted;" Feb. 15, 2012; pp. 1-17.

Jeong, et al.; "Wideband Envelope Tracking Power Amplifiers With Reduced Bandwidth Power Supply Waveforms and Adaptive Digital Predistortion Techniques;" IEEE Transactions on Microwave Theory and Techniques; vol. 57; No. 12; Dec. 2009; pp. 3307-3314.

Kimball, et al.; "50% PAE WCDMA Basestation Amplifier Implemented with GaN HFETs;" IEEE Compound Semiconductor Integrated Circuit Symposium; Oct. 2005; pp. 89-92.

(Continued)

*Primary Examiner* — Henry Choe
(74) *Attorney, Agent, or Firm* — Daly, Crowley, Mofford & Durkee, LLP

(57) ABSTRACT

An envelope tracking power amplifier uses signal cancellation techniques to provide isolation between RF signals and envelope signals, without the use of filters. In this manner, the envelope tracking power amplifiers are capable of operating with envelope signals that are at or near the frequency of the corresponding RF signals. In at least one embodiment, a double balanced power amplifier is provided that includes a balanced RF input port, a balanced RF output port, and a balanced envelope input port. The balanced nature of the amplifier results in ports of the amplifier forming virtual grounds with respect to signals at other ports. In some other embodiments, a single balanced amplifier is provided that provides isolation between ports thereof.

24 Claims, 8 Drawing Sheets

(56) References Cited

OTHER PUBLICATIONS

Li, ett al,; "LTE Power Amplifier Module Design; Challenges and Trends;" Solid-State and Integrated Circuit Technology (ICSICT), 2010 10$^{th}$ IEEE International Conference; Nov. 1-4, 2010; pp. 192-195.

Auriga Microwave, "Very Wideband Envelope Tracking;" Presentation; Jan. 19, 2012; 26 pages.

Extended European Search Report for Appl. No. 13155144.2 filed Nov. 13, 2013.

Notice of Allowance and issue Fee Due, U.S. Appl. No. 13/492,840, 7 pages, Feb. 11, 2014.

Response to the European Search Report and Search Opinion as filed Nov. 13, 2013 for Application No. 13155144.2 filed Feb. 14, 2013.

* cited by examiner

ENVELOPE TRACKING AMPLIFIER

CROSS REFERENCE TO RELATED APPLICATION

The present application claims the benefit of U.S. Provisional Patent Application No. 61/599,101 filed on Feb. 15, 2012, which is incorporated by reference herein in its entirety.

FIELD

Subject matter described herein relates to radio frequency (RF) circuits and, more particularly, to RF amplifier circuits.

BACKGROUND

As is known in the art, it is generally desirable that radio frequency (RF) power amplifiers operate as efficiently as possible. One technique for improving the efficiency of RF power amplifiers is known as envelope tracking. Using envelope tracking, efficiency can be improved by causing the direct current (DC) power supply voltage of the power amplifier to track the envelope of the RF input signal of the amplifier. By having the power supply voltage of the power amplifier track the envelope of the RF input signal, the amplifier can be maintained at or near a saturation point during operation, which is typically the most efficient region of operation. Example implementations of envelope tracking are described in, for example, U.S. Pat. No. 6,788,151 to Shvarts et al. and U.S. Pat. No. 7,482,869 to Wilson.

One problem with envelope tracking is that relatively complex circuitry is typically needed to provide a desired power supply voltage that is modulated to the envelope of the RF input signal. In some cases, the envelope signal may be generated by detecting the RF input signal, processing the detected signal to extract an envelope of the signal, and subsequently providing the envelope signal to a power supply modulator to generate the voltage for the power amplifier. In this approach, the circuits all have to be synchronized with one another, which can be relatively difficult to achieve. Furthermore, this technique is typically performed with analog signals. Consequently, the circuits used to generate the supply voltage for the power amplifier may be sensitive to differences in component operating characteristics caused by, for example, manufacturing tolerances and/or differences in the operating environment (e.g., ambient temperature, etc.).

In conventional power amplifiers that use envelope tracking, the bandwidth of the envelope signal is typically limited. For example, in some recent systems, power amplifiers are only capable of tracking multi-tone signals within a bandwidth of 40 MHz or less. However, many modern applications require much higher modulation bandwidths. In some cases, modulation bandwidths may be required that are at or near the RF frequency. Conventional envelope tracking techniques are not capable of supporting such modulation bandwidths. That is, in conventional systems, isolation between envelope and RF signals in an envelope tracking amplifier is typically provided using low pass filters. Low pass filters are not effective when the modulation frequencies approach those of the RF.

In an electronic warfare (EW) environment, counter-measure systems must be prepared to transmit multi-tone signals anywhere in a broad frequency band. These frequency bands may be as wide as 2 GHz or more in some cases. Current envelope tracking amplifier technology is not able to meet this demand for two reasons: (1) envelope-modulated power-supply technology cannot provide high power at high modulation frequencies, and (2) isolation between the envelope and RF signal is difficult to achieve Techniques and circuits are desirable that are capable of providing envelope tracking power amplification in systems and networks where high modulation bandwidths are possible. Techniques and circuits are also desirable that are capable of providing isolation between envelope signals and RF signals in an envelope tracking power amplifier, without the use of filters.

SUMMARY

Balanced envelope tracking power amplifier architectures and techniques are described herein that can be used to provide efficient radio frequency (RF) power amplification. Both single balanced and double balanced amplifiers are provided in various embodiments. In at least one embodiment, a double balanced amplifier is provided where all signals (i.e., RF input, RF output, and envelope signals) are driven differentially at virtual ground nodes to other signals. This allows isolation to be achieved between RF and envelope ports of the amplifier without the use of filters. In addition, because low pass filters are not used, envelope signals may be employed that are at or near the RF frequency. A further advantage of this architecture is that higher amplifier output impedances can be achieved than in conventional envelope tracking amplifiers. That is, input and output impedance levels are much higher than a single device, making it easier for a broadband application to adapt to different platforms.

A further advantage of the double balanced power amplifier is that it increases the slew rate of the output signal when a differential envelope signal is used. Because of the increased slew rate, the envelope bandwidth of the amplifier will be approximately double that of the original envelope signal. Furthermore, the double balanced power amplifier is capable of achieving relatively high output power levels because the voltage across the double balanced power amplifier is twice that of a single device. In addition, efficient operation at lower power levels can be achieved by applying lower voltage level signals across appropriate ports. In one application, a double balanced power amplifier can be used as an output power stage.

Single balanced envelope tracking power amplifiers are also provided in various embodiments. In a single balanced approach, a balanced RF input signal may be used to drive gate terminals of two field effect transistors (FETs). An unbalanced envelope signal may be provided to the RF neutral point at the drain terminals of the two FETs. An output balun may also be provided that has a balanced port coupled to the drain terminals of the two FETs. The single ended port of the output balun may then serve as the output port of the amplifier. As will be appreciated, the envelope port is isolated from RF signals because RF signals are balanced and envelope port is at the RF neutral. Isolation between envelope amplifier. RF balanced amplifier is thus achieved. An input balun may also be provided to generate the balanced RF input signal applied to the gate terminals of the two FETs.

In accordance with one aspect of the concepts, systems, circuits, and techniques described herein, an envelope tracking power amplifier comprises: an amplifier core having at least two field effect transistors (FETs) coupled in a balanced configuration; an RF input port coupled to the amplifier core to provide an RF input signal to the amplifier core; an RF output port coupled to the amplifier core to output an amplified RF output signal; and an envelope input port coupled to the amplifier core to provide an envelope signal to the amplifier core, the envelope signal being representative of an envelope of the RF input signal; wherein the envelope tracking power amplifier provides a high level of isolation between the envelope input port and the RF input and output ports, without the use of a filter to provide the isolation.

In accordance with another aspect of the concepts, systems, circuits, and techniques described herein, an envelope tracking power amplifier comprises: first and second field effect transistors (FETs) coupled in series at drain and source terminals thereof in a first branch between first and second nodes, the first branch having a third node located between the first and second FETs; third and fourth FETs coupled in series at drain and source terminals thereof in a second branch between the first and second nodes, the second branch having a fourth node located between the third and fourth FETs; a balanced RF input port coupled to gate terminals of the first, second, third, and fourth FETs; a balanced RF output port coupled to the third and fourth nodes; and a balanced envelope port coupled to the first and second nodes; wherein the first and second nodes form virtual grounds with respect to differential signals at the RF input port and differential signals at the RF output port.

In accordance with a still another aspect of the concepts, systems, circuits, and techniques described herein, a method for performing envelope tracking power amplification comprises: providing a quad field effect transistor (FET) circuit; applying an envelope signal to first and second nodes of the quad FET circuit; applying an RF input signal to third and fourth nodes of the quad FET circuit; and extracting a balanced RF output signal from fifth and sixth nodes of the quad FET circuit, wherein the first and second nodes are at virtual grounds with respect to the RF input signal and the RF output signal, and wherein the third and fourth nodes are at virtual grounds with respect to the RF input signal and the envelope signal.

In accordance with yet another aspect of the concepts, systems, circuits, and techniques described herein, a method for operating a single balanced envelope tracking power amplifier having first and second field effect transistors (FETs) each including a gate terminal, a drain terminal, and a source terminal, comprises: applying a differential RF input signal to gate terminals of the first and second field effect transistors (FETs); applying unbalanced envelope signals to drain terminals of the first and second FETs; and extracting an RF output signal from the drain terminals of the first and second FETs through an output balun, the output balun having a balanced port coupled to the drain terminals of the first and second FETs and a single-ended port forming an RF output port of the power amplifier.

BRIEF DESCRIPTION OF THE DRAWINGS

The foregoing features may be more fully understood from the following description of the drawings in which.

DETAILED DESCRIPTION

Techniques and circuits described herein relate to envelope tracking power amplifier designs that are capable of efficient operation, even when relatively high modulation bandwidths are used. The power amplifiers described herein use a balanced architecture to maintain isolation between RF signals and envelope signals in the amplifier. In addition, in some implementations, power amplifiers are provided that are capable of generating an output modulation slew rate that is approximately twice the modulation of an RF input signal. In some embodiments, amplifier designs are provided that are capable of delivering a wide range of power levels across a wide frequency band. In this manner, the amplifiers are well suited for use in applications where component level re-configurability is desired that allows the amplifier to adapt between a variety of different standards, systems, and/or waveforms. As such, amplifier designs described herein may have applications in any communication, radar, electronic warfare (EW), and/or signal intelligence applications, as well as other applications. In some embodiments, the structures and circuits described herein may be used to perform general modulation tasks in communication systems and/or other types of systems and are not limited to use in amplifier applications.

Figure 1:
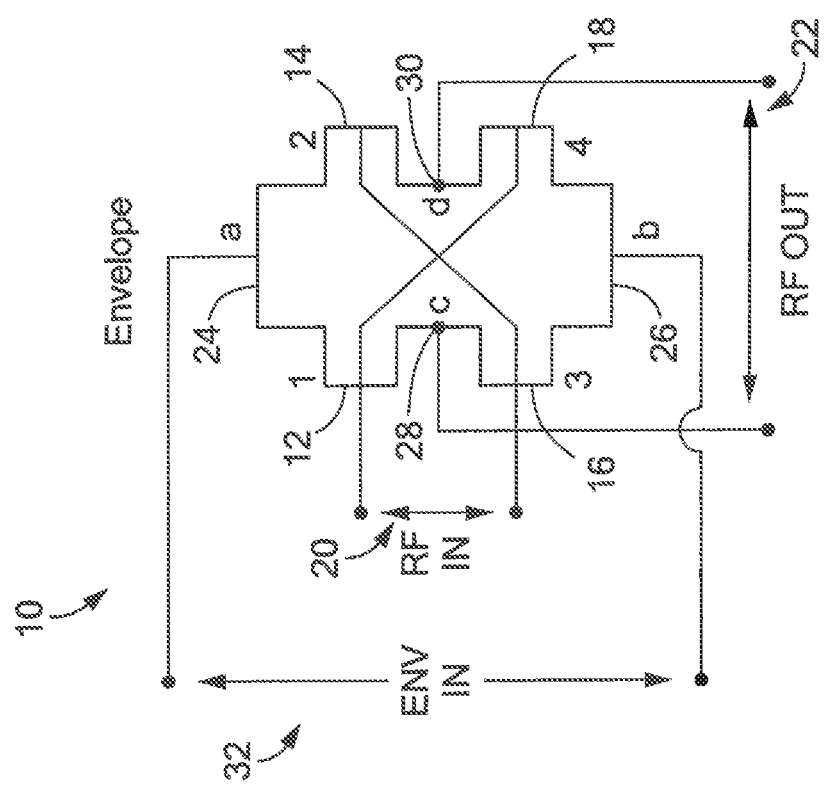
FIG. 1 is a schematic diagram illustrating a double balanced power amplifier having differential radio frequency (RF) inputs in accordance with an embodiment.

FIG. 1 is a schematic diagram illustrating an exemplary double balanced power amplifier 10 in accordance with an embodiment. As illustrated, double balanced power amplifier 10 includes four field effect transistors (FETs) 12, 14, 16, 18 arranged in a quad configuration. As shown, amplifier 10 includes a first branch connected between a first node 24 (node a) and a second node 26 (node b) having FET 12 coupled in series with FET 16 and a second, parallel branch coupled between first node 24 and second node 26 having FET 14 connected in series with FET 18. A balanced RF input port 20 is coupled to gate terminals of the FETs 12, 14, 16, 18 to drive the power amplifier using a differential RF input signal. A balanced RF output port 22 is coupled to nodes 28, 30 on the two branches (between corresponding FETs) to carry a differential RF output signal of the amplifier 10. A balanced envelope input port 32 is coupled across node 24 and node 26 to apply a differential envelope signal to the double balanced power amplifier 10. This balanced approach results in an amplifier 10 where all ports are located at virtual grounds of the other ports, resulting in a natural isolation between the envelope and RF signals without requiring the use of low pass filters or other filtration structures. For example, node 24 and node 26 form a virtual ground for RF input port 20 and RF output port 22. Similarly, node 28 and node 30 form a virtual ground for RF input port 20 and envelope input port 32.

Because of the natural isolation between the ports, there is no limitation between the RF and envelope frequencies that can be used. If the circuit structures can be made perfectly symmetrical, then the envelope and RF signals will theoretically be perfectly isolated, even if they are at the same frequency. Even if small imbalances exist, high levels of isolation can still be achieved using the architecture.

As shown in FIG. 1, the gates of FETs 12, 14, 16, 18 are driven in a crossed manner. That is, a first of the differential input lines is coupled to upper FET 12 in the first branch and lower FET 18 in the second branch and a second differential input line is coupled to lower FET 16 in the first branch and upper FET 14 in the second branch. This arrangement allows the first and second branches to operate at opposite phase to each other, thus creating virtual grounds at nodes 24 and 26 (a and b) for the RF signals.

As described above, differential envelope signals may be injected at envelope port 32 across node 24 and node 26 of amplifier 10. Because the envelope signals are moving in opposite directions at the nodes 24 and 26, the FETs 12, 14, 16, 18 will be excited with a slew rate that is twice the rate of the injected envelope. This increased slew rate translates to expanded envelope bandwidth, extending the limit of envelope tracking. In addition, this expanded envelope bandwidth provides an increased level of adaptability to future communication systems or EW systems which require much higher envelope bandwidth. A DC bias voltage may be applied to nodes 24, 26. The level of DC bias may be adjusted based on a required output power level of amplifier 10.

FETs 12, 14, 16, 18 can include any type of field effect transistors capable of providing the necessary power including, for example, junction FETS, metal oxide semiconductor FETs (MOSFETs), laterally diffused MOSFETs (LDMOS), metal semiconductor FETs (MESFETs), heterostructure FETs (HFETs), high electron mobility transistors (HEMTs), pseudomorphic HEMTs (pHEMTs), metamorphic HEMTs (mHEMTs), and/or others. Other types of transistors may alternatively be used (e.g., bipolar junction transistors (BJTs), heterojunction bipolar transistors (HBTs), high voltage HBTs (HV-HBTs), etc.). In addition, transistors using any of a variety of different materials or material combinations may be used including, for example, silicon, silicon carbide, gallium arsenide, gallium nitride, indium gallium arsenide, aluminum gallium arsenide, and/or others. In some implementations, matched devices may be used for the FETs 12, 14, 16, 18.

Figure 2:
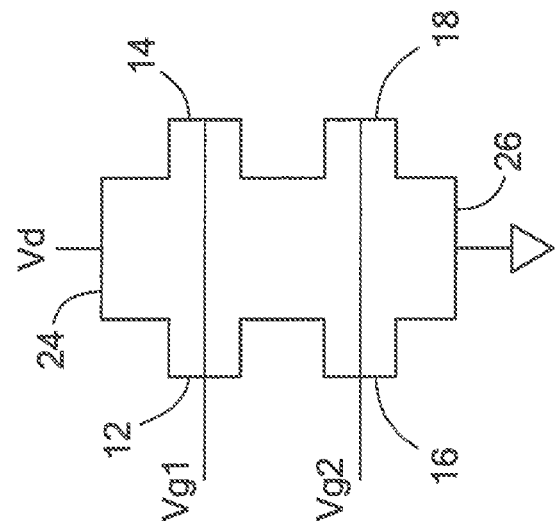
FIG. 2 is a schematic diagram illustrating direct current (DC) bias inputs to the double balanced power amplifier of FIG. 1 in accordance with an embodiment.

FIG. 2 is a schematic diagram illustrating direct current (DC) bias inputs that may be made to double balanced power amplifier 10 of FIG. 1 in accordance with an embodiment. As shown, a voltage $V_d$ may be applied from node 24 to node 26 to bias the quad FETs 12, 14, 16, 18. In addition, gate bias voltages $V_{g1}$, $V_{g2}$ may be applied to the gate terminals of the FETs 12, 14, 16, 18. Gate bias voltages $V_{g1}$ and $V_{g2}$ may be set relative to nodes 24, 26, respectively, through large resistors. It should be noted that, unlike the RF input signals, the gate bias voltages $V_{g1}$, $V_{g2}$ are not applied in a crossed manner. That is, $V_{g1}$ is applied to the upper FETs 12, 14 in both branches and $V_{g2}$ is applied to the lower FETs 16, 18. For this reason, the gate voltages $V_{g1}$, $V_{g2}$ cannot be directly superimposed on the input RF power terminals.

Figures 3, 4:
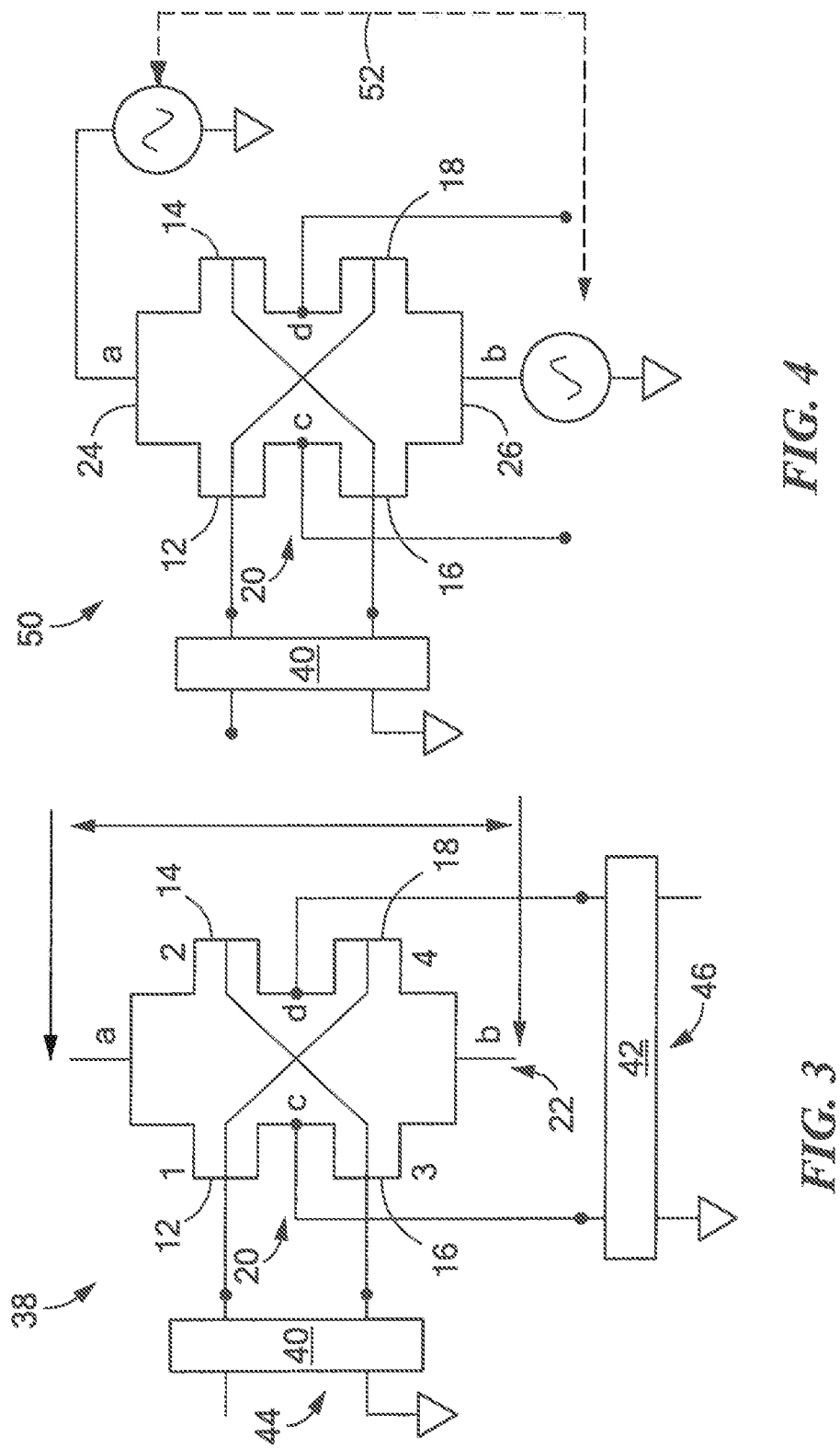
FIG. 3 is a schematic diagram illustrating the double balanced power amplifier of FIG. 1 with balun circuits coupled to an RF input and an RF output of the amplifier in accordance with an implementation.
FIG. 4 is a schematic diagram illustrating the double balanced power amplifier of FIG. 1 with a balanced envelope signal coupled thereto in accordance with an implementation.

FIG. 3 is a schematic diagram illustrating a double balanced power amplifier 38 having baluns coupled to the balanced RF input port and the balanced RF output port in accordance with an embodiment. More specifically, a first balun 40 is coupled to the balanced RF input port 20 of amplifier 38 and a second balun 42 is coupled to the balanced RF output port 22. The baluns 40, 42 enable single-ended signals to be input and output from amplifier 38 at corresponding single ended ports 44, 46. In addition, as will be described in greater detail, in some embodiments, input balun 44 may be configured in a manner that allows the gate voltages $V_{g1}$, $V_{g2}$ of FIG. 2 to be superimposed onto the appropriate gate terminals of FETs 12, 14, 16, 18. In some implementations, transmission line transformer type baluns are used (e.g., using coaxial cable, etc.); however, other types of baluns may be used in other implementations. In at least one embodiment, a balun may also, or alternatively, be provided at the balanced envelope input port.

FIG. 4 is a schematic diagram illustrating a double balanced power amplifier 50 having an input balun 40 coupled to the balanced RF input port 20 and having a differential envelope signal 52 applied across a balanced envelope input port (across nodes 24, 26) in accordance with an embodiment. This envelope signal source is superimposed with DC bias voltage. As is known, a differential signal includes signals on two balanced lines that are inverted versions of each other (i.e., the voltage potentials of the two signals are moving in opposite directions at any particular time). Therefore, as described above, by using a differential envelope signal at the balanced envelope input port, the peak slew rate of the envelope signal is effectively doubled when combined in amplifier 50.

Figure 5:
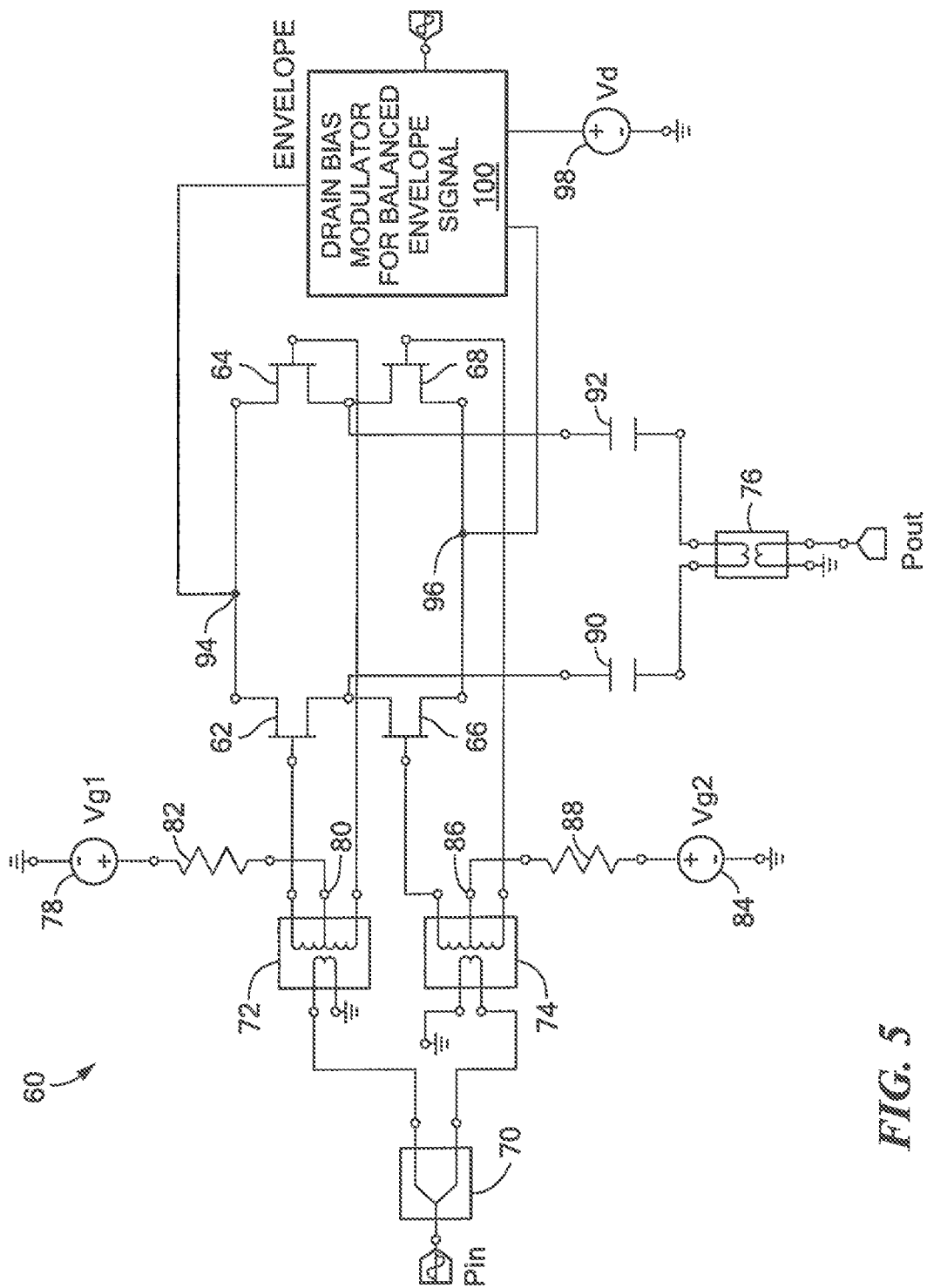
FIG. 5 is a schematic diagram of a double balanced power amplifier using two RF input baluns to provide DC bias voltages to gate terminals of transistors of the amplifier in accordance with an embodiment.

FIG. 5 is a schematic diagram illustrating an exemplary double balanced power amplifier 60 in accordance with an embodiment. Double balanced power amplifier 60 is a specific implementation of amplifier 10 of FIG. 1 operative at an RF frequency of 2 GHz with a 25 volt bias. As illustrated, double balanced power amplifier 60 includes four GaN HEMTs 62, 64, 66, 68 arranged in a quad configuration. Each of the HEMTs 62, 64, 66, 68 includes a 6×200 μm total periphery in the implementation. It should, of course, be appreciated that other transistor types and sizes may be used in other embodiments. A 3 dB power splitter 70 may be provided to split a single-ended RF input signal (Pin) into two equal (or substantially equal) magnitude signal components. A pair of RF input baluns 72, 74 may also be provided to convert each of the equal magnitude signal components to differential RF input signals for application to gate terminals of the HEMTs 62, 64, 66, 68. As shown, the RF input baluns 72, 74 are arranged so that substantially the same signal is applied to the gate terminals of HEMT 62 and HEMT 68 and substantially the same signal is applied to the gate terminals of HEMT 64 and HEMT 66 (similar to the arrangement illustrated in FIG. 1).

Double balanced power amplifier 60 may also include an RF output balun 76 to provide a single-ended RF output signal. DC blocking capacitors 90, 92 may be provided to prevent DC signals from reaching output balun 76.

As shown in FIG. 5, first and second RF input baluns 72, 74 may be used to provide gate bias voltages to the gates of HEMTs 62, 64, 66, 68. As described previously, the gate bias voltages cannot be simply superimposed on the gate lines of the HEMTs 62, 64, 66, 68 because of the way the RF input signals are being applied. The RF input baluns 72, 74 allow the gate bias voltages to be applied in the appropriate manner. As illustrated, a first voltage source 78 may be coupled to a center tap 80 of an output winding of first RF input balun 72 to provide a first gate bias voltage $V_{g1}$. A resistor 82 may be placed between source 78 and center tap 80 in some implementations. The voltage $V_{g1}$ will thus be directly applied to the gate terminals of the upper HEMTs 62, 64. In a similar manner, a second voltage source 84 may be coupled to a center tap 86 of an output winding of second RF input balun 74 to provide a second gate bias voltage $V_{g2}$. A resistor 88 may be placed between source 84 and center tap 86 in some implementations. The voltage $V_{g2}$ will thus be directly applied to the gate terminals of lower HEMTs 66, 68.

In an alternative approach, dc blocking capacitors may be used to provide DC isolation between the different gate terminals of the HEMTs 62, 64, 66, 68 to allow different bias voltages to be applied thereto.

In the double balanced power amplifier 60 of FIG. 5, a drain bias modulator 100 is provided to apply a drain bias for the HEMTs 62, 64, 66, 68 and to also apply a differential envelope input signal across nodes 94 and 96 at the top and bottom of the two transistor branches. A power supply 98 is coupled to drain bias modulator 100 to supply the drain bias voltage $V_d$.

In some embodiments, an envelope tracking double balanced power amplifier may be used as part of a reconfigurable transceiver system that is capable of adapting to different RF systems, signals, protocols, and/or waveforms. As such, the same transmitter circuitry may be continually re-programmed during system operation to work in disparate wireless signaling environments. In some embodiments, reconfigurable transceiver systems may be provided that are capable of being easily upgraded for use with new and emerging wireless technologies.

Figure 6:
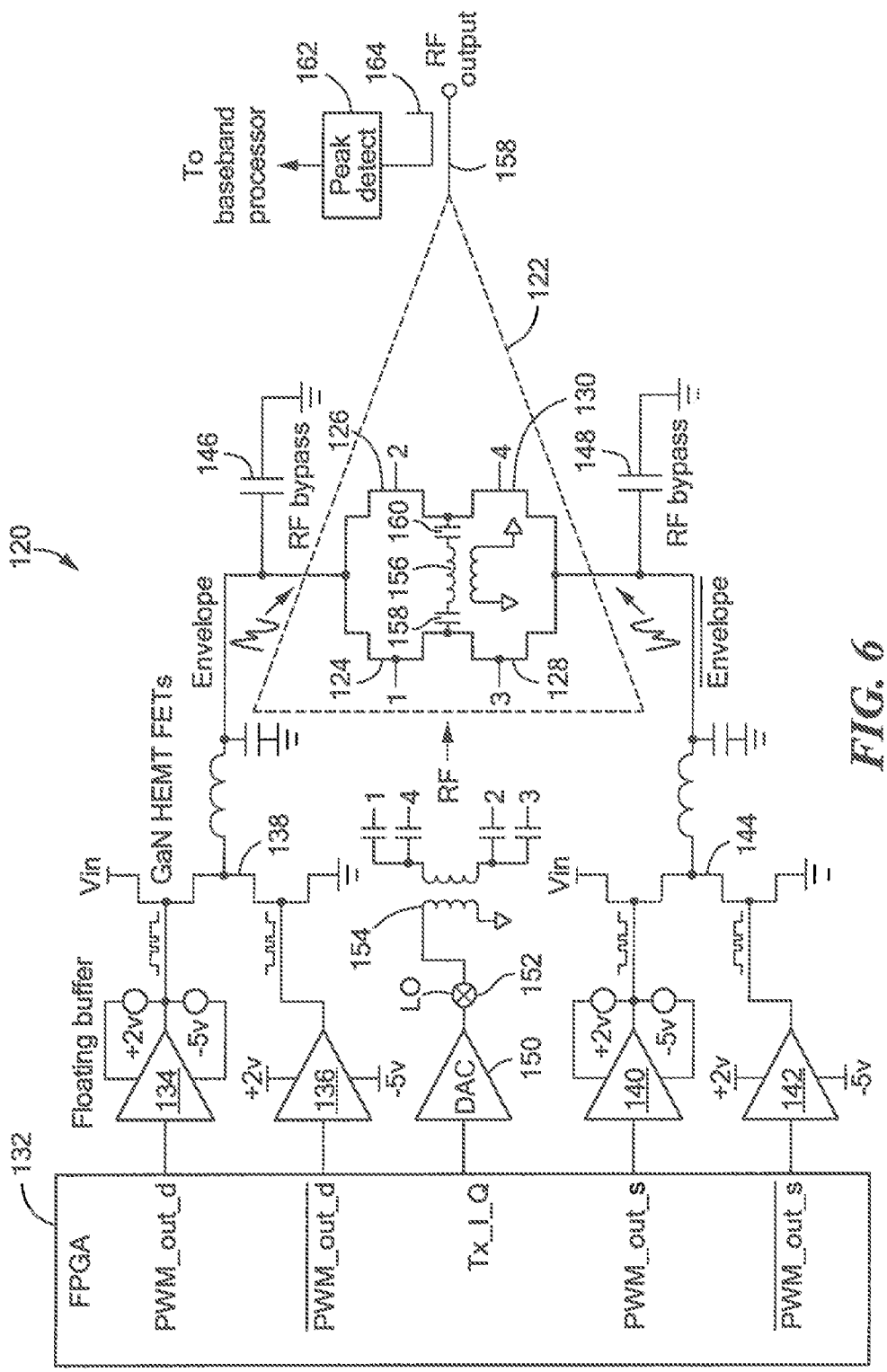
FIG. 6 is a schematic diagram illustrating a final power amplification stage of a reconfigurable wireless transmitter system in accordance with an embodiment.

FIG. 6 is a schematic diagram illustrating a final power amplification stage 120 of a reconfigurable wireless transmitter system in accordance with an embodiment. As illustrated, power amplification stage 120 includes an envelope tracking double balanced power amplifier 122 that comprises four FETs 124, 126, 128, 130 arranged in a quad arrangement, as described previously. In some implementations, power amplification stage 120 may be capable of adapting to various communication waveforms, including, for example, constant envelope waveforms and high peak-to-average modulated signals. Power amplification stage 120 may also be capable of operating across a relatively wide bandwidth and/or at widely varying output power levels.

As shown in FIG. 6, power amplification stage 120 may include a field programmable gate array (FPGA) 132 that is capable of adapting operating parameters associated with the envelope tracking double balanced power amplifier 122 during operation for use with different waveforms. The FPGA 132 may receive digital I-Q data from a radio baseband processor (not shown) for use with double balanced power amplifier 122. In an alternative approach, the radio baseband processor functionality may be implemented within the FPGA 132. Although illustrated as an FPGA in FIG. 6, it should be appreciated that other types of digital processors may be used in other embodiments, including other forms of reconfigurable hardware. In the illustrated embodiment, FPGA 132 includes two pulse width modulators for use in generating a differential envelope signal for amplifier 122. In addition, FPGA 132 includes circuitry for outputting a digital baseband signal for amplifier 122 representing, for example, data to be transmitted from the corresponding wireless transmitter. FPGA 132 may be configured to provide a time delay to the digital baseband signal to provide synchronization between the signal and the envelope signal provided to amplifier 122. In some embodiments, FPGA 132 may be re-configured on the fly to generate envelope signals and digital baseband signals for various different communication waveforms.

A first pulse width modulator of FPGA 132 may generate a first PWM output signal (PWM_out_d) and a complementary version of the first PWM output signal ($\overline{\text{PWM\_out\_d}}$) to be applied to first and second level shifting drivers 134, 136. Driver 134 may be a floating driver that is not coupled directly to ground. Outputs of drivers 134, 136 may be applied to gate terminals of FETs within a modulator output stage 138. In at least one embodiment, the level shifting drivers 134, 136 may be implemented using B-CMOS technology and the FETs of modulator output stage 138 may be GaN HEMTs (although other device types and processes may be used in other implementations). As shown, the output signal of modulator output stage 138 may be low pass filtered before reaching the first envelope input terminal of double balanced amplifier 122.

In a similar manner, a second pulse width modulator of FPGA 132 may generate a second PWM output signal (PWM_out_s) and a complementary version of the second PWM output signal ($\overline{\text{PWM\_out\_s}}$) to be applied to third and fourth level shifting drivers 140, 142. As with driver 134 discussed above, driver 140 may be a floating buffer. Outputs of drivers 140, 142 may be applied to gate terminals of FETs within a second modulator output stage 144. The output signal of modulator output stage 144 may be low pass filtered before reaching the second envelope input terminal of double balanced amplifier 122. As shown, RF bypass capacitors 146, 148 may be provided on the differential envelope input terminals of amplifier 122 to provide an RF path to ground.

In some implementations, the PWM streams generated by FPGA 132 may be completely independent of one another so that they can be individually tailored to adjust amplitude and phase between the differential outputs. This tailoring can be used to, for example, compensate for asymmetry in the amplifier 122, thereby reducing distortion and/or increasing common-mode rejection ratio (CMRR).

The envelope tracking bandwidth capability of power amplification stage 120 will typically be limited by, for example, the PWM clock frequency used by FPGA 132. To produce a low distortion envelope waveform, the PWM clock frequency should be about 5-10 times the required analog envelope bandwidth (e.g., about 150 MHz for a 20 MHz envelope bandwidth). The slew rate of power amplification stage 120 may be related to bandwidth as follows:

$$f_{max} = S_r/2\pi * V_{peak}.$$

where $f_{max}$ is the bandwidth, $S_r$ is the slew rate, and $V_{peak}$ is the peak voltage level. As described previously, the use of a differential envelope signal doubles the voltage slew rate of the power amplifier 122, effectively doubling the tracking bandwidth available for a given PWM clock rate. This enables the PWM clock rate to be reduced, saving battery power while maintaining ET bandwidth.

As shown in FIG. 6, FPGA 132 delivers the digital baseband signal to a digital to analog converter (DAC) 150 to convert the signal to an analog baseband representation. The analog baseband signal may then be applied to an up-converter 152 to up-convert the signal to an RF carrier frequency based on a local oscillator (LO) signal. In at least one embodiment, FPGA 132 may also control the frequency of the LO signal to set the RF carrier frequency. Other techniques for providing frequency up-conversion may alternatively be used. The up-converted signal may next be applied to one or more baluns 154 to generate differential (balanced) RF input signals to be applied to the gates of FETs 124, 126, 128, 130. In at least one implementation, two baluns may be used (as shown in FIG. 5) to provide both RF input signals and DC bias to the gate terminals of FETs 124, 126, 128, 130.

An output balun 156 may be provided across the RF output nodes of amplifier 122 to provide a single-ended output signal. RF coupling capacitors 158, 160 may be provided to block DC from reaching output balun 156. In some implementations, a peak detector 162 may be provided for detecting a peak level of an RF output signal of amplifier 122. The peak information may then be fed back to FPGA 132 for use in, for example, adjusting an output power level of amplifier 122. A directional coupler 164 may be used to couple off a portion of the RF output signal for use by peak detector 162. Any type of coupler may be used.

As described previously, in some implementations, power amplification stage 120 of FIG. 6 may be used as part of a re-configurable transmitter system to generate a wide range of different output waveforms. Any number of different criteria may be used to determine when to switch between different waveforms (e.g., different wireless standards, etc.). In some implementations, power amplification stage 120 may be configured for manual switching between waveforms based on user action. In other implementations, automated switching between waveforms may be implemented, where power amplification stage 120 switches between waveforms in an automated fashion based on, for example, predetermined rules programmed into the system (e.g., programmed into FPGA 132, etc.). Hybrid systems that allow both manual and automatic switching between waveforms/standards may also be provided in some embodiments.

In at least one exemplary implementation, the power amplification stage 120 of FIG. 6 was implemented in a reconfigurable transmitter system that covers the military communication frequency range from 0.2-2.5 GHz with an output power level range from 1-100 W. The transmitter system was capable of maintaining high efficiency while adapting to various communication waveforms, including both constant envelope waveforms and high peak-to-average modulated signals. In tests, the reconfigurable transmitter system was shown to operate with a wide range of different waveforms including, for example, those associated with both commercial wireless communication standards (e.g., SM/EDGE, LTE, 802.11g and b) and military communication standards (e.g., Soldier Radio Waveform (SRW), UHF-AM (Have Quick), Wideband Networking Waveform (WNW)). In simulations, it has been shown that, for constant envelope waveforms (e.g., GSM, SRW, etc.), the DC bias voltage across the envelope input terminals (e.g., nodes 94, 96 in FIG. 5) can be varied to accommodate different output power levels while still maintaining high-efficiency operation. In addition, simulations have also shown that, for modulated waveforms (e.g., CDMA, OFDM, etc.), high efficiency operation may be maintained for both average power levels and peak power levels.

In some implementations, FPGA 132 may provide digital slew rate reduction and/or digital pre-distortion to the to the baseband I-Q signals received from a baseband processor function. The digital pre-distortion (DPD) may be used to, for example, achieve a desired linearity metric to meet a required adjacent channel power ratio (ACPR) performance given a desired power added efficiency (PAE) and associated output power back-off. In an envelope tracking power amplifier, as the drain voltage is modulated, the operating characteristics of the amplifier may change. In at least one implementation, a DPD process used by FPGA 132 may monitor a changing drain voltage of amplifier 122 and utilize a set of adaptation coefficients to more optimally respond to the time-varying nonlinear characteristic of amplifier 122.

Figure 7:
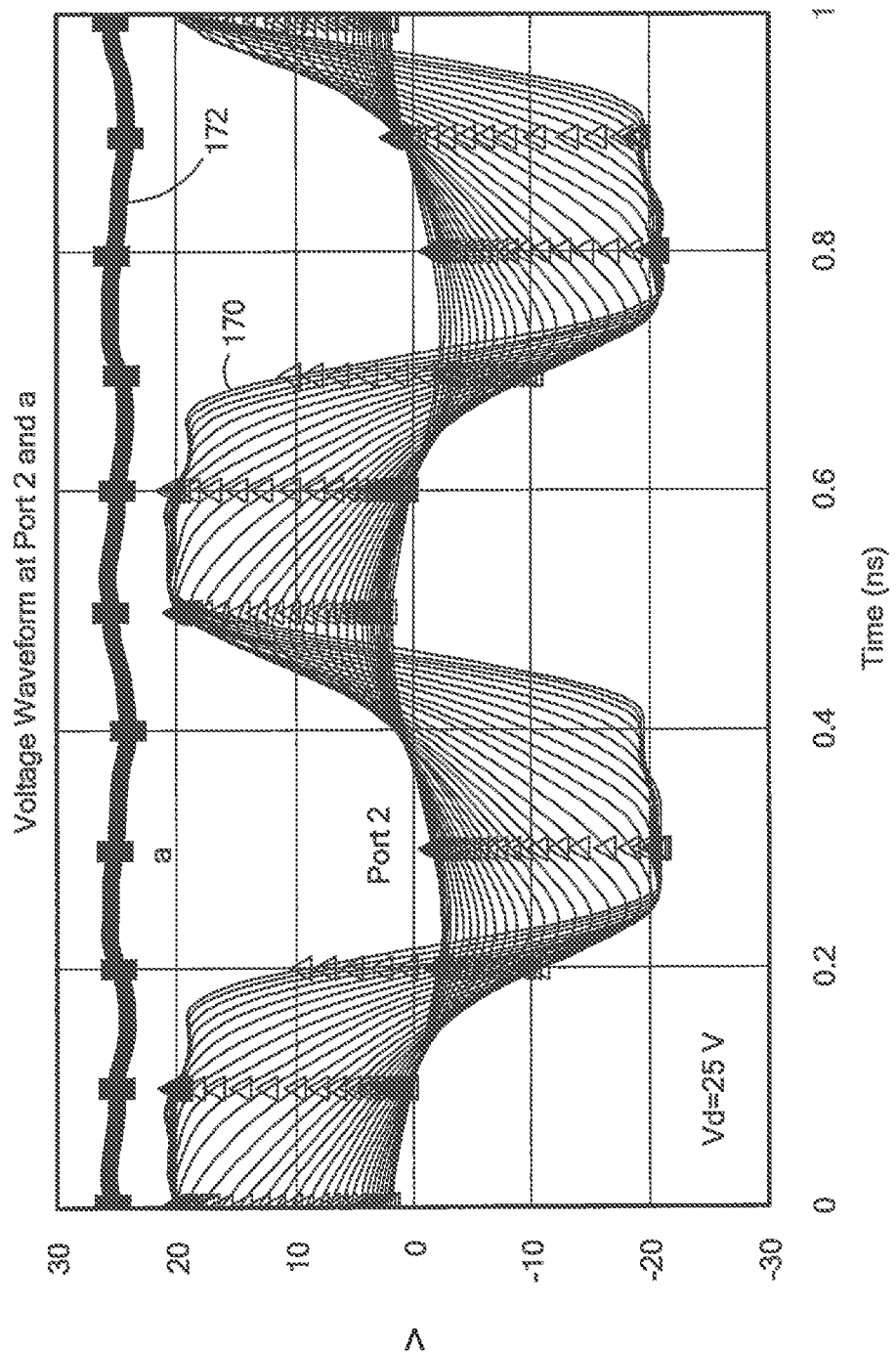
FIG. 7 is a signal plot illustrating an RF output signal of a double balanced envelope tracking power amplifier in accordance with an embodiment.

FIG. 7 is a signal plot illustrating an RF output signal 170 of an RF output balun of an envelope tracking double balanced power amplifier across a 50 ohm load in accordance with an embodiment. The plot is for a bias voltage of 25 volts and includes traces for varying input power levels ranging from 2 to 25 dBm. The relatively square waveforms in the plot demonstrate that the power amplifier can be operated in a high efficiency class D switching mode. It should be noted that the input and output baluns of the amplifier have resulted in cancellation of odd mode harmonics in the output signal. Also shown in FIG. 7 is the signal 172 on "node a" (e.g., node 94 in FIG. 5) of the double balanced amplifier. As illustrated, signal 172 shows that the RF leakage power to "node a" is relatively small, confirming that RF to envelope isolation is large. The small ripple is most likely caused by a slight imbalance in the waveforms on the balanced RF output terminals of the amplifier.

Figure 8:
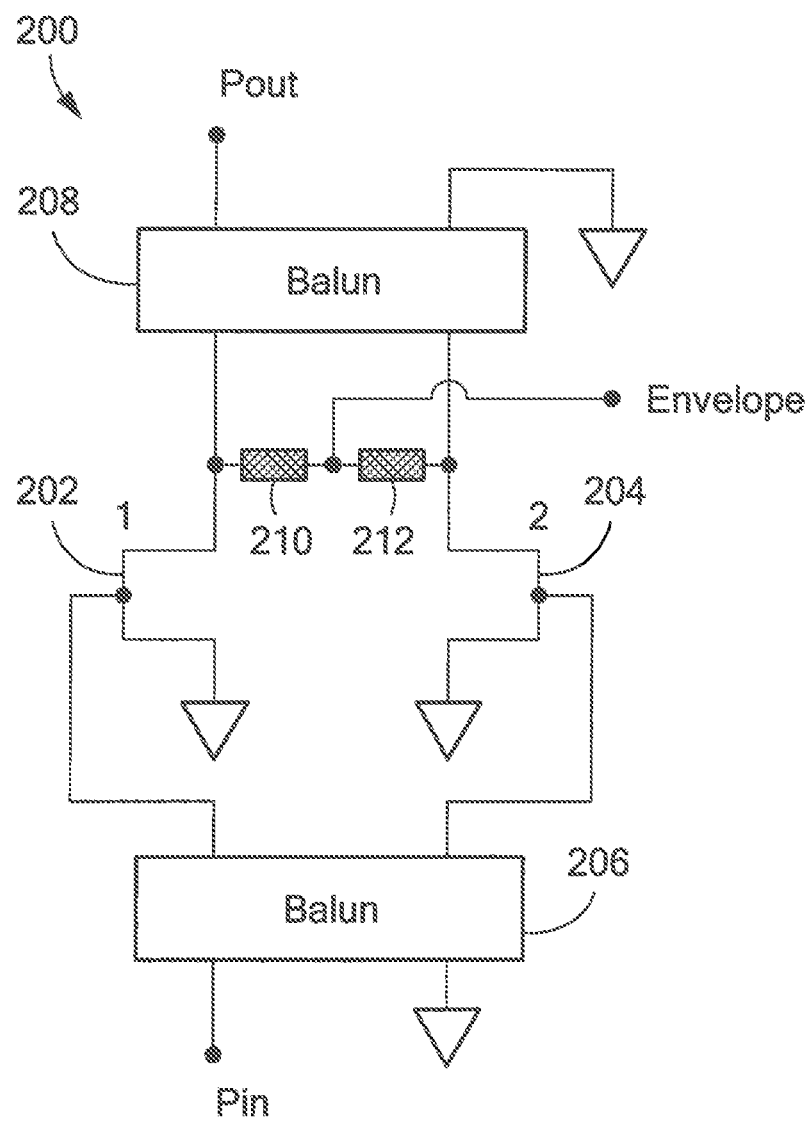
FIG. 8 is a schematic diagram illustrating a single balanced envelope tracking power amplifier in accordance with an embodiment.

In the embodiments discussed above, double balanced envelope tracking power amplifier architectures were described. In some embodiments, however, at least some of the same principles may be used to provide single balanced envelope tracking power amplifiers. FIG. 8 is a schematic diagram illustrating a single balanced envelope tracking power amplifier 200 in accordance with an embodiment. As illustrated, single balanced envelope tracking power amplifier 200 includes a single pair of FETs 202, 204 operated in a balanced arrangement. An input balun 206 is provided to convert a single ended RF input signal ($P_{in}$) into a balanced signal to drive gate terminals of the FETs 202, 204. An output balun 208 is coupled to drain terminals of FETs 202, 204 to convert corresponding balanced output signals to a single ended RF output signal ($P_{out}$). Source terminals of FETs 202, 204 may be coupled to ground (or some other reference potential). A pair of equal length transmission line segments 210, 212 may be used to couple an envelope signal (Envelope) to the drain terminals of FETs 202, 204. If the circuitry is sufficiently balanced, a node between the transmission line segments 210, 212 will act as a virtual ground to the RF signals on the drain terminals of FETs 202, 204. In addition, the envelope signal components on the drain terminals of FETs 202, 204 will be in phase and will therefore cancel in output balun 208, providing isolation between the envelope signal and the RF output signal ($P_{out}$). In some alternative embodiments, the transmission line segments 210, 212 may be replaced by inductors or other low pass filter structures, or other elements. As will be appreciated, single balanced envelope tracking power amplifier 200 of FIG. 8 is a simpler design than the double balanced structures described previously, but still provides the desired isolation between RF and envelope signals.

Figure 9A:
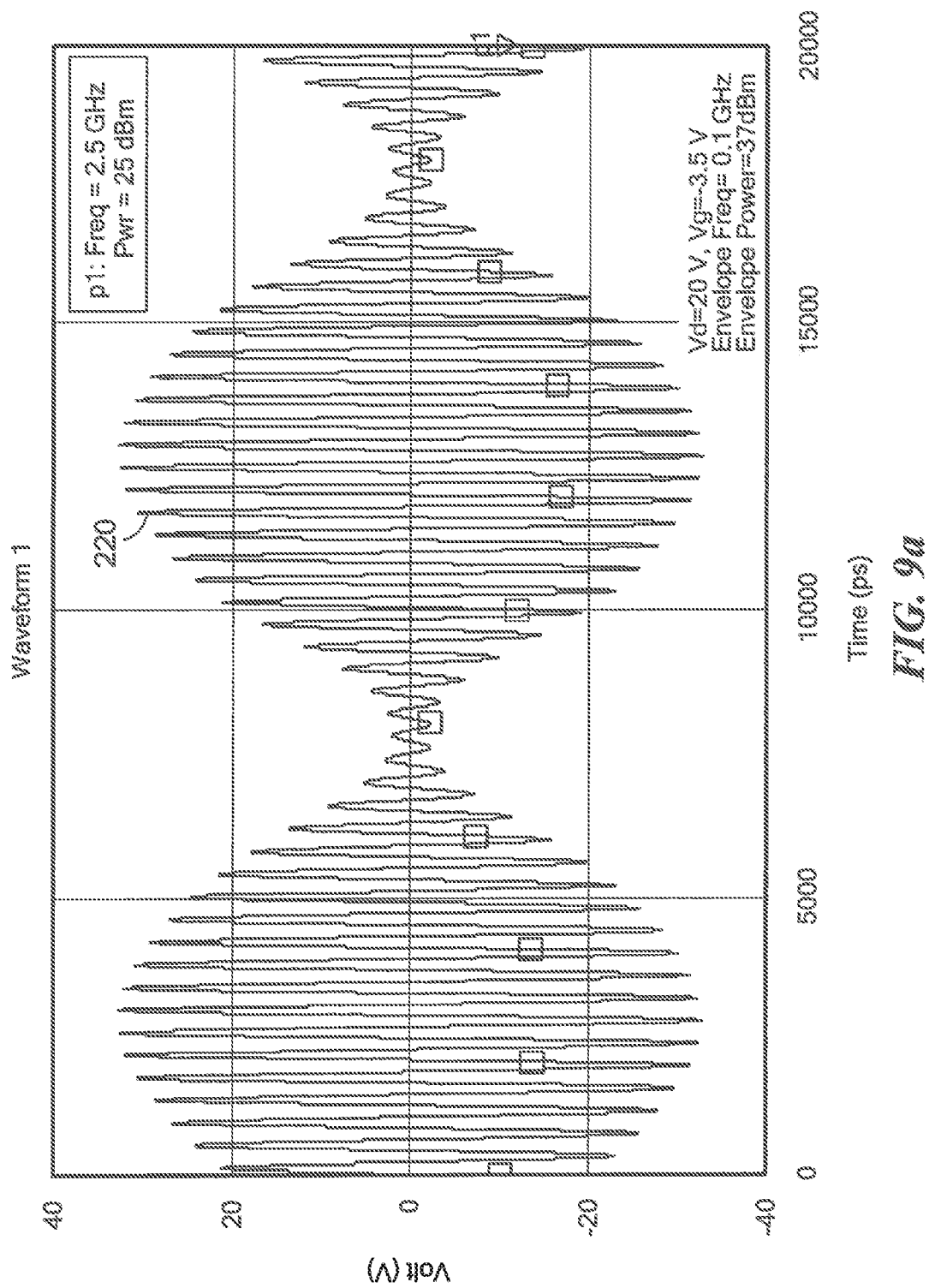
FIGS. 9a and 9b are plots illustrating output waveforms of a single balanced envelope tracking power amplifier in accordance with an embodiment.
Figure 9B:
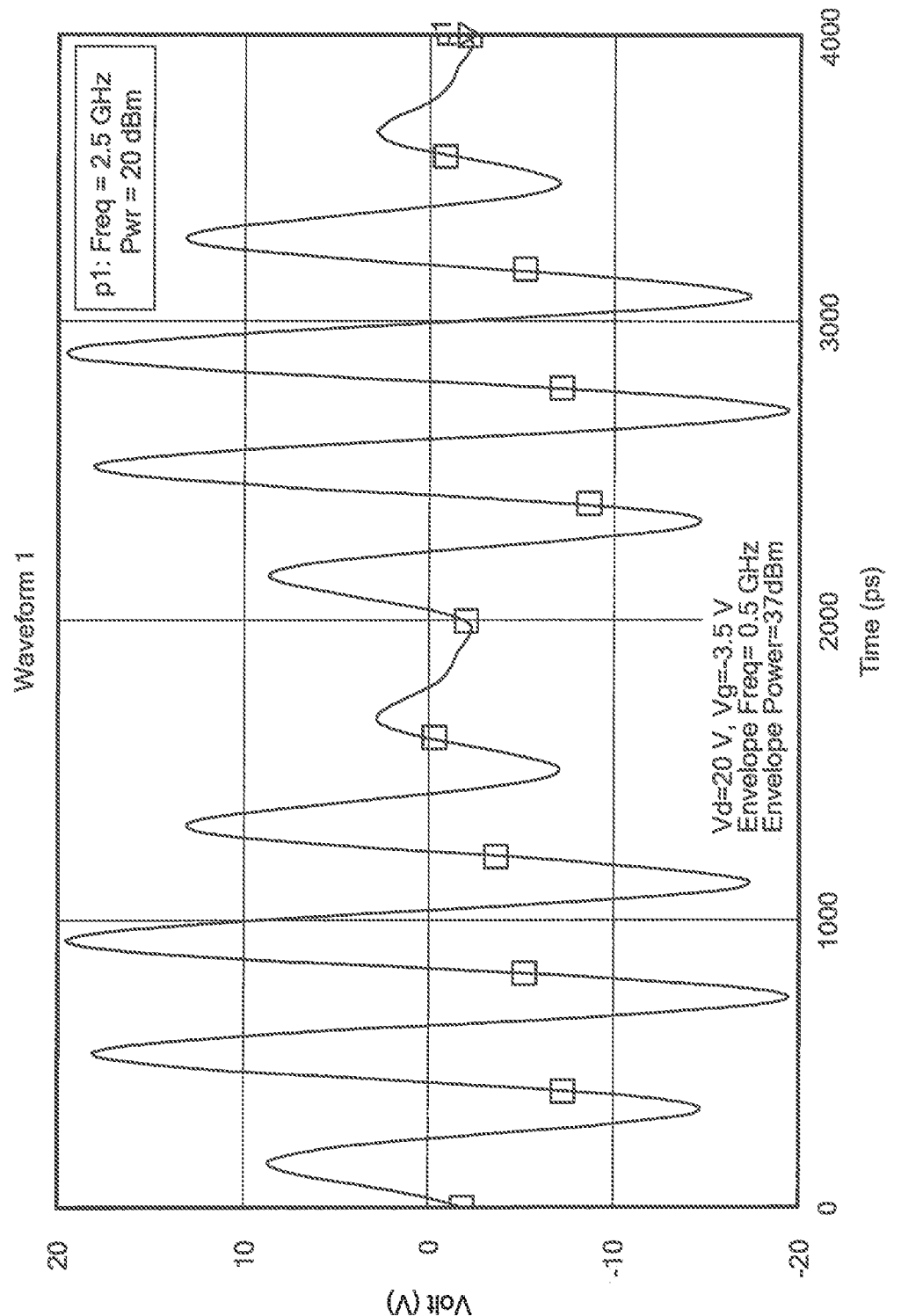

FIGS. 9a and 9b are plots illustrating simulated output waveforms of the single balanced envelope tracking power amplifier 200 of FIG. 8 for envelope signals having different frequencies (i.e., 0.1 GHz in FIG. 9a and 0.5 GHz in FIG. 9b). A single tone RF input signal of 2.5 GHz was used in each case. A drain bias voltage is also applied at the envelope input port. As shown, in each case, the carrier signal is successfully modulated at frequencies comparable to the carrier frequency. This therefore shows that the envelope tracking function is operative over a relatively wide bandwidth (0.5 GHz). When the carrier frequency is moved to a higher frequency, the modulation frequency may also be moved higher, overlapping the RF signal frequency band. This may be a valuable feature in, for example, an electronic warfare environment where multiple RF signals may be found in a wide frequency band and the separation between the RF signals can be as large as the RF signal band.

To recap, the envelope tracking amplifier structures and techniques described herein are, in different embodiments, capable of achieving various advantages over conventional envelope tracking amplifiers, which may include one or more of the following: (a) providing virtual ground ports that provide natural isolation between signals, eliminating the need for high-order, low-pass filters; (b) doubling the peak slew rate of the envelope signal; (3) amplifier may be operated in a high-efficiency switching mode over a wide dynamic range; (4) high-efficiency operation may be maintained for all envelope levels under a modulated signal with high peak-to-average ratio (PAPR); (5) operation may be achieved over a wide frequency range; (6) higher output power levels may be achieved because the voltage across the amplifier can be twice that of amplifiers that use only a single device; (7) efficient operation can be maintained at lower power levels by applying lower voltages across the envelope input terminals; and (8) input and output impedance levels can be made much higher than an amplifier using a single device, making it easier for a broadband application to adapt to different platforms.

Having described preferred embodiments which serve to illustrate various concepts, circuits, and techniques which are the subject of this patent, it will now become apparent to those of ordinary skill in the art that other embodiments incorporating these concepts, circuits, and techniques may be used. For example, described herein is specific exemplary circuit topologies and specific circuit implementations for achieving a desired performance. It is recognized, however, that the concepts and techniques described herein may be implemented using other circuit topologies and specific circuit implementations. Accordingly, it is submitted that that scope of the patent is not limited to the described embodiments, but rather should be limited only by the spirit and scope of the following claims.

What is claimed is:

1. An envelope tracking power amplifier, comprising:
   an amplifier core having at least two field effect transistors (FETs) coupled in a balanced configuration;
   an RF input port coupled to the amplifier core to provide an RF input signal to the amplifier core;
   an RF output port coupled to the amplifier core to output an amplified RF output signal; and
   an envelope input port coupled to the amplifier core to provide an envelope signal to the amplifier core, the envelope signal being representative of an envelope of the RF input signal;
   wherein the envelope input port forms a virtual ground with respect to signals at the RF input and output ports, and the RF output port forms a virtual ground with respect to a signal at the envelope input port.

2. The power amplifier of claim 1, wherein:
   the envelope tracking power amplifier is capable of operation with an envelope input signal that is at or near the frequency of the RF input signal.

3. The power amplifier of claim 1, wherein:
   the amplifier core includes four FETS in a quad arrangement.

4. The power amplifier of claim 3, wherein:
   the RF input port, the RF output port, and the envelope input port are balanced ports.

5. The power amplifier of claim 4, wherein:
   the RF output port forms a virtual ground with respect to a differential envelope signal applied to the envelope input port.

6. The power amplifier of claim 5, wherein:
   the envelope input port forms a virtual ground with respect to differential RF signals applied to the RF input port.

7. The power amplifier of claim 4, wherein:
   the amplifier core includes first and second FETs coupled in series at drain and source terminals thereof in a first branch between first and second nodes and third and fourth FETs coupled in series at drain and source terminals thereof in a second branch between the first and second nodes, wherein the balanced envelope input port is coupled across the first and second nodes.

8. The power amplifier of claim 7, wherein;
   the first node is closer to the first FET than the second FET within the first branch and the first node is closer to the third FET than the fourth FET within the second branch; and
   the balanced RF input port is configured to deliver substantially equivalent RF input signal components to gate terminals of the first FET and the fourth FET and substantially equivalent RF input signal components to gate terminals of the second FET and the third FET.

9. The power amplifier of claim 7, wherein:
   the first branch includes a third node between the first and second FETs and the second branch includes a fourth node between third and fourth FETs, wherein the balanced RF output port is coupled across the third and fourth nodes.

10. The power amplifier of claim 9, further comprising:
    at least one first balun coupled to the balanced RF input port and a second balun coupled to the balanced RF output port.

11. The power amplifier of claim 7, wherein:
    the envelope of the RF output signal has a slew rate that is approximately twice that of the envelope input signal.

12. The power amplifier of claim 1, wherein:
    the amplifier core includes two FETS, each having a gate terminal, a drain terminal, and a source terminal; and
    the power amplifier further comprises:
    a first balun having a balanced port and a single ended port, the balanced port of the first balun being coupled to the gate terminals of the first and second amplifiers and the single ended port of the first balun forming the RF input port of the power amplifier; and
    a second balun having a balanced port and a single ended port, the balanced port of the second balun being coupled to the drain terminals of the first and second amplifiers and the single ended port of the second balun forming the RF output port of the power amplifier.

13. The power amplifier of claim 12, further comprising:
    a first circuit element having a first end and a second end, the first end of the first circuit element coupled to as drain terminal of the first FET and the second end of the first circuit element coupled to a first node; and
    a second circuit element having a first end and a second end, the first end of the second circuit element coupled to a drain terminal of the second FET and the second end of the second circuit element coupled to the first node;
    wherein the first node forms the envelope input port of the power amplifier.

14. The power amplifier of claim 13, wherein:
    the first and second circuit elements include at least one of: equal length transmission line segments, inductors, or low pass filters.

15. An envelope tracking power amplifier comprising:
    first and second field effect transistors (FETs) coupled in series at drain and source terminals thereof in a first branch between first and second nodes, the first branch having a third node located between the first and second FETs;
    third and fourth FETs coupled in series at drain and source terminals thereof in a second branch between the first and second nodes, the second branch having a fourth node located between the third and fourth FETs;

a balanced RF input port coupled to gate terminals of the first, second, third, and fourth FETs;

a balanced RF output port coupled to the third and fourth nodes; and a balanced envelope port coupled to the first and second nodes;

wherein the first and second nodes form virtual grounds with respect to differential signals at the RF input port and differential signals at the RF output port, and the third and fourth nodes form virtual grounds with respect to a signal at the envelope input port.

16. The power amplifier of claim 15, wherein:
the third and fourth nodes form virtual grounds with respect to differential signals at the envelope input port.

17. The power amplifier of claim 15, wherein:
the RF output signal has a slew rate that is approximately twice that of the envelope input signal.

18. The power amplifier of claim 15, wherein:
the balanced RF input port includes a first terminal and a second terminal, wherein the first terminal is coupled to gate terminals of the first and fourth FETs and the second terminal is coupled to gate terminals of the second and third FETs, wherein the first node is closer to the first FET than the second FET and the first node is closer to the third FET than the fourth FET.

19. The power amplifier of claim 15, further comprising:
means for providing a first DC bias voltage to gate terminals of the first and third FETs; and
means for providing a second DC bias voltage to gate terminals of the second and fourth FETs.

20. A method for performing envelope tracking power amplification comprising:
providing a quad field effect transistor (FET) circuit;
applying an envelope signal to first and second nodes of the quad FET circuit;
applying an RF input signal to third and fourth nodes of the quad FET circuit; and
extracting a balanced RF output signal from fifth and sixth nodes of the quad FET circuit, wherein the first and second nodes are at virtual grounds with respect to the RF input signal and the RF output signal, and wherein the fifth and sixth nodes are at virtual grounds with respect to the RF input signal and the envelope signal.

21. The method of claim 20, wherein:
applying the RF input signal to third and fourth nodes of the quad FET circuit comprises applying the RF input signal to an input of a balun having a balanced output port that is coupled to the third and fourth nodes.

22. The method of claim 20, wherein:
extracting a balanced output signal includes coupling output signals at the fifth and sixth nodes of the quad FET circuit to a balanced input port of a balun.

23. The method of claim 20, wherein:
applying an envelope signal to first and second nodes of the quad FET circuit includes applying a differential envelope signal to the first and second nodes.

24. The method of claim 23, wherein:
applying the differential envelope signal to the first and second nodes of the quad FET circuit results in a slew rate of the envelope of the RF output signal being twice that of the envelope input signal.

* * * * *